（12） United States Patent
Asano et al.

(10) Patent No.: US 6,833,608 B2
(45) Date of Patent: Dec. 21, 2004

(54) SEMICONDUCTOR DEVICE AND PACKAGING SYSTEM THEREFORE

(75) Inventors: Tetsuro Asano, Ora-gun (JP); Mikito Sakakibara, Osato-gun (JP); Hideyuki Inotsume, Ora-gun (JP); Haruhiko Sakai, Ota (JP); Shigeo Kimura, Nitta-gun (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/294,912

(22) Filed: Nov. 15, 2002

(65) Prior Publication Data

US 2003/0137044 A1 Jul. 24, 2003

(30) Foreign Application Priority Data

Nov. 15, 2001 (JP) ........................................ 2001-350553

(51) Int. Cl.$^7$ ............................................. H01L 23/495
(52) U.S. Cl. ........................ 257/666; 257/784; 257/723; 438/111
(58) Field of Search ................................. 257/666, 676, 257/784, 723, 724; 438/111, 123, 110

(56) References Cited

U.S. PATENT DOCUMENTS

| 4,595,945 A | * | 6/1986 | Graver ........................ 257/666 |
| 4,612,564 A | * | 9/1986 | Moyer ......................... 257/666 |
| 4,937,656 A | * | 6/1990 | Kohara ........................ 257/676 |
| 5,663,594 A | * | 9/1997 | Kimura ....................... 257/666 |
| 5,907,769 A | * | 5/1999 | Corisis |
| 6,133,622 A | * | 10/2000 | Corisis et al. .............. 257/666 |
| 6,268,652 B1 | * | 7/2001 | Kimura |
| 6,313,520 B1 | * | 11/2001 | Yoshida et al. |
| 6,504,236 B2 | * | 1/2003 | Bissey |

* cited by examiner

*Primary Examiner*—S. V. Clark
(74) *Attorney, Agent, or Firm*—Morrison & Foerster LLP

(57) ABSTRACT

Two different switches with two different signal input schemes are fabricated by mounting the same semiconductor chip on the same lead pattern. Two of the leads of the lead pattern provides space enough for wire-bonding connection to corresponding electrode pads on the semiconductor chip at both ends of the semiconductor chip. Because each of electrode pads can be connected to the corresponding lead at either end of the semiconductor chip, two sets of bonding wire connection between the leads and the electrode pads provides two different switches with two different signal inputs scheme.

19 Claims, 9 Drawing Sheets

PRIOR ART

PRIOR ART

SEMICONDUCTOR DEVICE AND PACKAGING SYSTEM THEREFORE

BACKGROUND OF THE INVENTION

1. Field of the Invention

This invention relates to a semiconductor device and its packaging, specifically to a packaging system for a semiconductor switching device that accommodates a change in an input scheme of control signals of the switching device by changing wire bonding positions while using a same semiconductor chip and a same lead pattern.

2. Description of the Related Art

Switching elements for high frequency signals have been a focus of development in many application areas including mobile communication equipment that utilizes microwaves in GHz frequency range and alternates antennas and receiving/transmitting signals. Such a device is described, for example, in Japanese Laid Open Patent Publication No. Hei 9-181642. This type of device often includes a field effect transistor (FET) functioning as a high frequency switch, which is made of a gallium arsenide (GaAs) material, and is integrated as a monolithic microwave integrated circuit (MMIC) having the high frequency switches.

FIG. 1A is a plan view of a conventional packaging of a semiconductor switching device 63, and FIG. 1B is a schematic cross-sectional view of the packaging of FIG. 1A cut along line B—B. The chip 63 is made of GaAs, and has an electrode pad I for receiving an input signal, two electrode pads C1, C2 for a pair of control signals and two electrode pads O1, O2 for emitting an output signal. The input electrode pad I is located between the two input electrode pads C1, C2. The chip 63 is mounted on an island 62e using a conducting paste 70, such as a solder. The electrode pads on the top surface of the chip 63 are connected to respective leads of a lead pattern 62 by bonding wires 64. Namely, the control electrode pad C1 is connected to a lead 62a, the input electrode pad I is connected to a lead 62b, the control electrode pad C2 is connected to a lead 62c, and the two output electrode pads O1, O2 are connected to leads 62d, 62f, respectively. The island 62e of the lead pattern 62, which is electrically connected to the chip 63, is connected to a ground voltage (reference voltage). A resin body 75 covers the chip 63 and the central portion of the lead pattern 62. The far ends of the leads extend from the side of the resin body 75. The lead pattern 62 is formed by a conventional stamping process.

The semiconductor switching device 63 has two switches (not shown in the figure), and each switch receives a control signal through the corresponding control electrode pad C1, C2, i.e., C1 is for a first switch and C2 is for a second switch, respectively. Such a switch is typically made of a field effect transistor (FET). A pair of control signals, for example signals A and B (not shown in the figure), which complement each other, is inputted to the two control electrode pads C1, C2, and then applied to the two switches of the device through the control electrode pads C1, C2. In one design, for example, signal A is applied to the first switch of the device through the control electrode pad C1, and signal B is applied to the second switch of the device through the control electrode pad C2. The chip 63 is manufactured to meet this specification so that the two control electrode pads C1, C2 are located close to their corresponding switches. This design is referred to as a normal control switch and is schematically shown in FIG. 2. However, in another design of the device, it may be required that signal A be applied to the second switch and signal B be applied to the first switch. This is referred to as a reverse control switch and is schematically shown in FIG. 3. In this reverse design, additional wiring is required to reverse the signal inputs as shown in FIG. 3. Accordingly, two different device manufacturing processes must be established for the two different device designs.

SUMMARY OF THE INVENTION

The invention provides a semiconductor device including an insulating substrate, a plurality of leads disposed on the substrate, and a semiconductor chip mounted on the insulating substrate and having a plurality of electrode pads disposed on its surface. The electrode pads are connected to the respective leads. The semiconductor chip is disposed with respect to two of the leads to leave areas of each of the two leads not covered by the semiconductor chip at each end of the semiconductor chip. The areas of the two leads are large enough for connecting corresponding leads to the corresponding electrode pads. A first of the two leads is connected to a first of the two electrode pads and a second of the two leads is connected to a second of the two electrode pads when the device is configured so that first of the two electrode pads receives a first signal and the second of the two electrode pads receives a second signal. The first of the two leads is connected to the second of the two electrode pads and the second of the two leads is connected to the first of the two electrode pads when the device is configured so that the first of the two electrode pads receives the second signal and the second of the two electrode pads receives the first signal.

The invention also provides a semiconductor device including a resin body, a plurality of leads embedded in the resin body, and a semiconductor chip embedded in the resin body and having a plurality of electrode pads disposed on its surface. The electrodes pads are connected to the respective leads. The semiconductor chip is disposed with respect to two of the leads to leave areas of each of the two leads uncovered by the semiconductor chip at the ends of the semiconductor chip. The areas of the two leads are large enough for connecting the two leads to the corresponding electrode pads. A first of the two leads is connected to a first of the two electrode pads and a second of the two leads is connected to a second of the electrode pads when the semiconductor device is configured so that the first of the two electrode pads receives a first signal and the second of the two electrode pads receives a second signal. The first of the two leads is connected to the second of the two electrode pads and the second of the two leads is connected to the first of the two electrode pads when the semiconductor device is configured so that the first of the two electrode pads receives the second signal and the second of the two electrode pads receives the first signal.

The invention further provides a device packaging system including an insulating substrate, a first lead disposed on the insulating substrate, a second lead disposed on the insulating substrate, and a surface mounted element mounted on the first and second leads so that at least a portion of each of the leads is left uncovered by the surface mounted element at both ends of the surface mounted element.

The invention also provides a device packaging system including a resin body, a first lead embedded in the resin body, a second lead embedded in the resin body, and a surface mounted element mounted on the first and second leads so that at least a portion of each of the leads is left uncovered by the surface mounted element at both ends of the surface mounted element.

The invention further provides a method of fabricating devices with different internal wirings. This method includes providing lead wiring means for allowing alternative wire bonding configurations, which have a first lead and a second lead, and mounting a surface mounted element on the lead wiring means, which has a first electrode pad and a second electrode pad. The method also includes connecting the first electrode pad to the first lead by a first bonding wire and connecting the second electrode pad to the second lead by a second bonding wire so that the first and second bonding wires do not intersect each other when a device of a first wiring configuration is fabricated, and connecting the first electrode pad to the second lead by the first bonding wire and connecting the second electrode pad to the first lead by the second bonding wire so that the first and second bonding wires do not intersect each other when a device of a second wiring configuration is fabricated.

DETAILED DESCRIPTION OF THE INVENTION

Figure 4A:
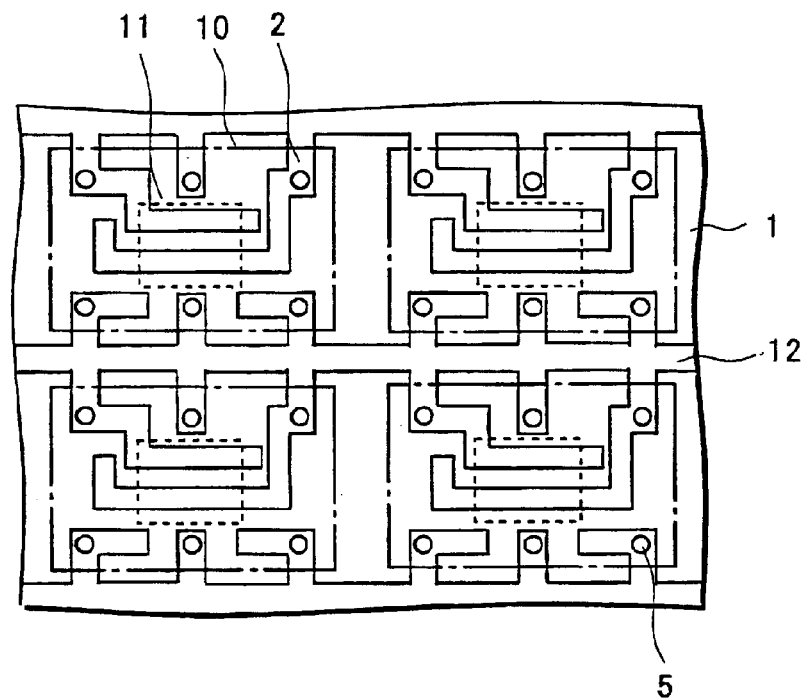
FIG. 4A is a plan view of a lead pattern of a first embodiment of the invention.

A semiconductor device with a packaging structure of a first embodiment of this invention is described with reference to FIGS. 4A–7. FIG. 4A show a lead pattern 2 formed on an insulating substrate 1 of the first embodiment. The insulating substrate 1 is a large insulating plate made of a ceramic, a glass epoxy resin or the like, or a stack of such insulating plates. The total thickness of the insulating substrate 1 is 180 to 250 µm, so that the substrate can withstand mechanical stresses it receives during manufacturing processes.

Figure 4B:
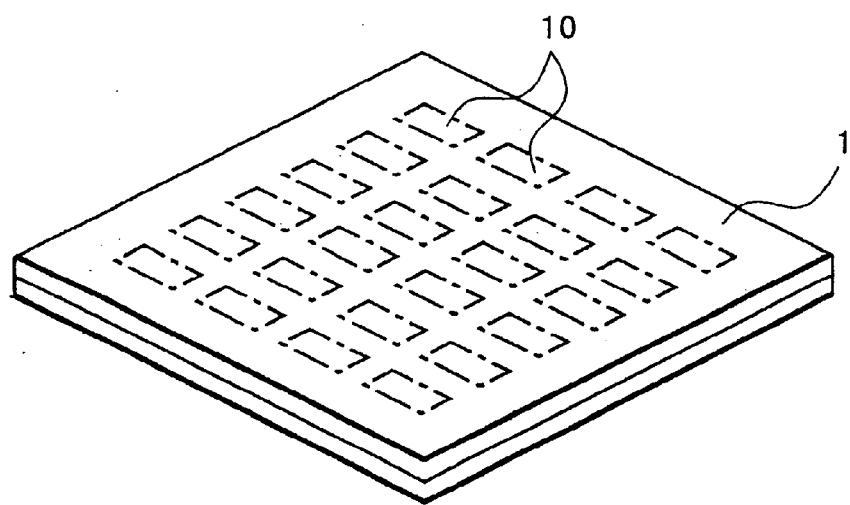
FIG. 4B is a perspective view of an insulating substrate having the lead pattern thereon of the first embodiment.

The lead pattern 2 for one packaging area 10, which is indicated by the unevenly broken lines in FIGS. 4A and 4B, includes six individual leads that are formed on the insulating substrate 1 and correspond to electrode pads formed on a semiconductor chip for packaging, as shown in FIG. 4A. The semiconductor chip is mounted on a chip mounting area 11. The six leads are formed by a gold plating, and two of the six leads penetrate through the chip mounting area 11 to provide areas for wire bonding at both ends of the chip mounting area 11. The lead pattern 2 does not have an island, such as the one shown FIG. 1A, and a semiconductor chip is mounted on the two leads penetrating though the chip mounting area 11 using an insulating resin. All the lead patterns 2 are identical among the individual packaging areas 10, and are connected by a connection portion 12. In this embodiment, the packaging area 10 is about 1.2 mm×0.8 mm, and the chip mounting area 11 is about 0.30 mm×0.37 mm, although the size of the chip mounting area 11 should be adjusted according to the size of a chip mounted thereon. The separations between the package areas 10 are about 100 µm in both the longitudinal and the transverse directions. This separation is required for dicing the substrate 1 into separate individual completed packages. The connection portion 12 is required to form the lead pattern 2 using gold plating. When electroless plating is used for forming the lead pattern 2, the connection portion is not required and the package areas 10 are formed to be separated from each other.

FIG. 4B is a perspective view of the insulating substrate 1 used in the first embodiment. The substrate 1 is large enough to provide more than one hundred package areas 10.

Figure 5:
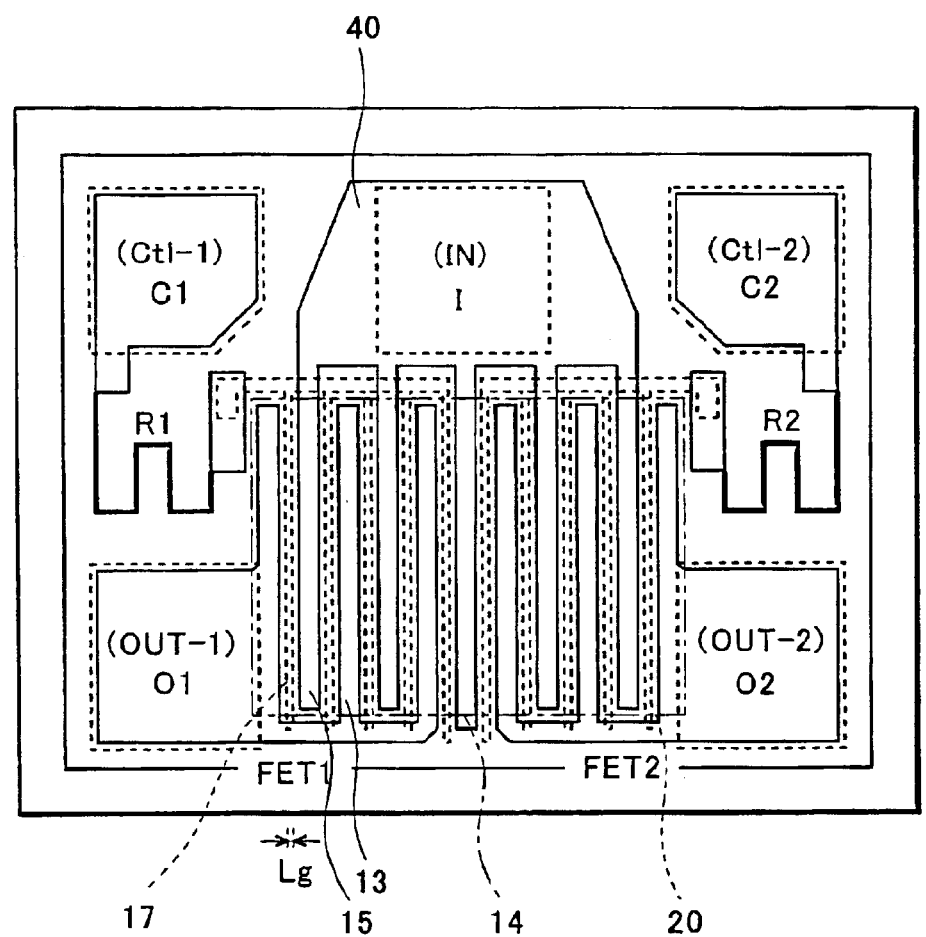
FIG. 5 is a plan view of a compound semiconductor chip of the first embodiment.

FIG. 5 is a plan view of the semiconductor chip 3 used in the first embodiment. The semiconductor chip 3 is a compound semiconductor switching device, and its circuit elements are formed on a GaAs substrate. The back side of the GaAs substrate is semi-insulating. The chip has two FETs, FET1, FET2 positioned in the central portion of the GaAs substrate. The gate electrodes 17 of FET1 and FET2 are connected to control electrode pads C1, C2, respectively, through corresponding resistors R1, R2. Both of the drain electrodes 15 of the two FETs are connected to an input electrode pad I. The source electrodes 13 of the two FETs are connected to output electrode pads O1, O2, respectively. All the electrode pads are positioned near the edge of the GaAs substrate, and correspond to the electrode pads of the semiconductor chip 3. This type of switching device is described in a commonly owned copending U.S. patent application Ser. No. 09/937,197, entitled "COMPOUND SEMICONDUCTOR DEVICE," the disclosure of which is, in its entirety, incorporated herein by reference.

A gate metal layer 20 made of Ti/Pt/Au is a second wiring layer indicated by the dotted lines in the figure, and includes the gate electrode 17, which forms a Schottky contact with a channel region of each FET. A pad metal layer 40 made of Ti/Pt/Au is a third wiring layer indicated by the solid lines in the figure, and provides electrode pads and connections between circuit elements. An ohmic metal layer made of AuGe/Ni/Au is a first wiring layer, and forms an ohmic contact with the GaAs substrate. The ohmic metal layer provides the source electrodes 13 and the drain electrodes 15 of the two FETs as well as contact portions of the resistors. The ohmic metal layer overlaps with the pad metal layer 40 and is omitted in the figure.

Figure 6A:
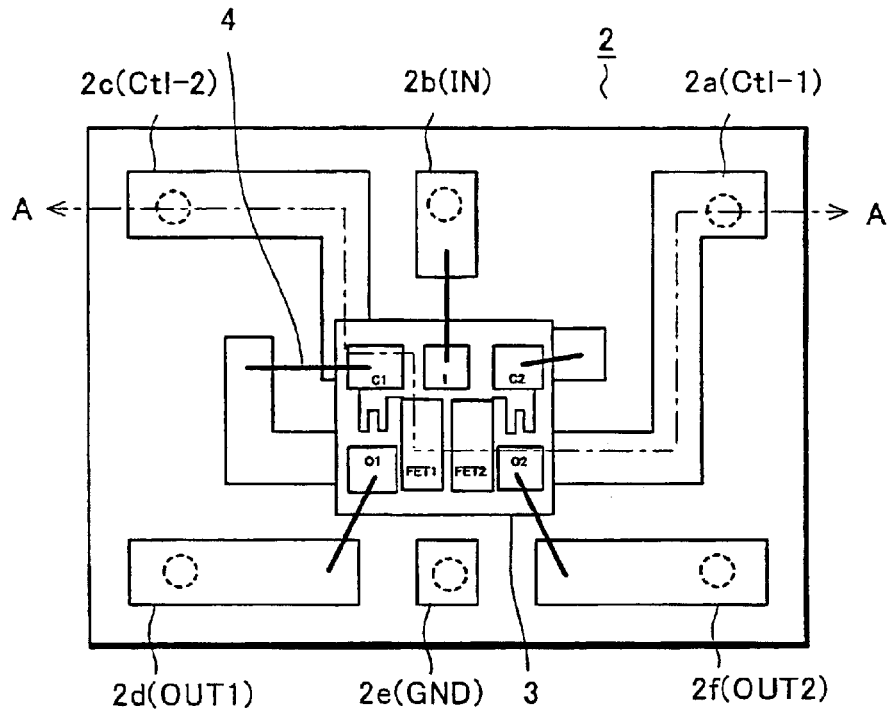
FIG. 6A is a plan view of a packaging with a reverse switch configuration using the lead pattern of FIG. 4A and the chip of FIG. 5.
Figure 6B:
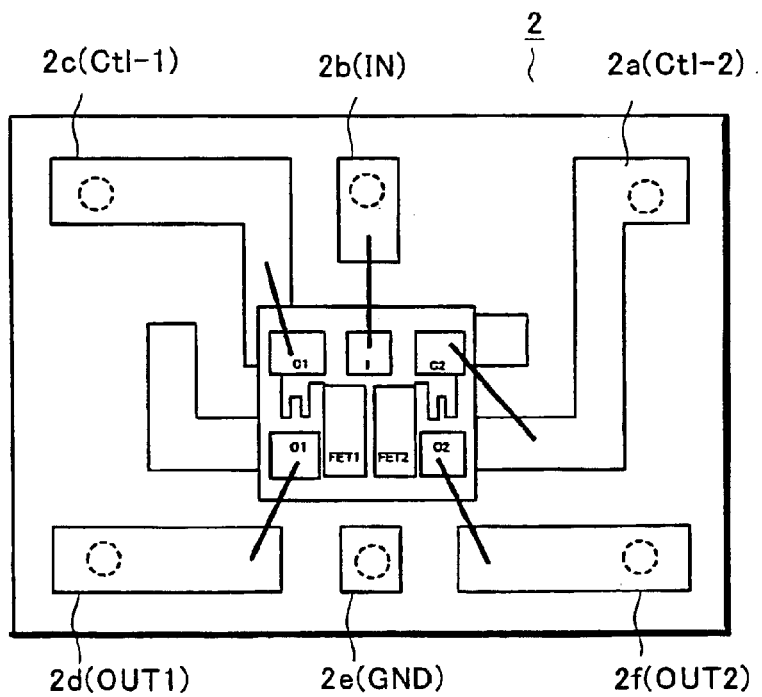
FIG. 6B is a plan view of a packaging with a normal switch configuration using the lead pattern of FIG. 4A and the chip of FIG. 5.

FIGS. 6A and 6B show two different configurations of the packaging of the first embodiment, which utilize the same lead pattern of FIG. 4A and the same semiconductor chip of FIG. 5. In the configuration of FIG. 6A, the semiconductor chip 3 is mounted on the two leads 2a, 2c penetrating through the chip mounting area using an insulating resin adhesive. The two leads 2a, 2c run underneath the semiconductor chip 3, and provide areas not covered by the semiconductor chip 3 at the ends of the semiconductor chip 3, that are large enough for connecting leads to the corresponding electrode pads on the semiconductor chip 3 by wire bonding. The mounting position of the semiconductor chip 3 may be adjusted as long as the uncovered areas are large enough and close enough to the chip 3 for wire bonding.

A lead 2b is connected to the input electrode pad I, a lead 2d to the output electrode pad O1, a lead 2f to the output electrode pad O2, the lead 2c to the control electrode pad C2, and the lead 2a to the control electrode pad C1. All the connections are made by wire-bonding the leads to the corresponding electrode pads by ball bonding or wedge bonding. The control electrode pad C1 may be connected to either of the two penetrating leads 2a, 2c at the left end of the semiconductor chip 3. In this configuration, it is connected to the lead 2a. Likewise, the control electrode pad C2 is connected to the lead 2c, instead of the lead 2a, at the right end of the semiconductor chip 3. The lead 2e is at a ground voltage (reference voltage).

In the configuration of FIG. 6B, the connections between the two penetrating leads 2a, 2c and the two control electrode pads C1, C2 are altered. That is, in this configuration, the control electrode pad C1 is connected to the lead 2c, and the control pad C2 is connected to the lead 2a. Other connections between the electrode pads and the leads are the same as those of FIG. 6A. In both configurations, there are no intersecting bonding wires, which can cause signal interference and larger packaging height.

The configuration of FIG. 6B is a normal control switch and the configuration of FIG. 6A is a reverse control switch. When a pair of complementary signals is applied to the device, signal A of the pair is applied to the lead 2c and signal B of the pair is applied to the lead 2a. In the normal control switch of FIG. 6B, signal A is applied to the gate electrode 17 of the FEF1 through the electrode pad C1, and signal B is applied to the gate electrode 17 of the FET2 through the electrode pad C2. In the reverse control switch of FIG. 6A, signal A is applied to the gate electrode 17 of FET2 and signal B is applied to the gate electrode 17 of the FET1.

For both of the configurations, the same lead pattern of FIG. 4A and the same semiconductor chip of FIG. 5 are used. The only difference is the connections between the penetrating leads 2a, 2c and the corresponding electrode pads C1, C2. These connections are made just by connecting the leads 2a, 2c to the corresponding electrode pads C1, C2. In other words, there is no need for changing the chip design or the lead pattern design. This is possible because each of the two leads 2a, 2c has areas large enough to allow wire bonding at both ends of the semiconductor chip. Accordingly, the packaging of the first embodiment provides both the normal and reverse control switches without any modification to the chip or the lead pattern.

Figure 1A:
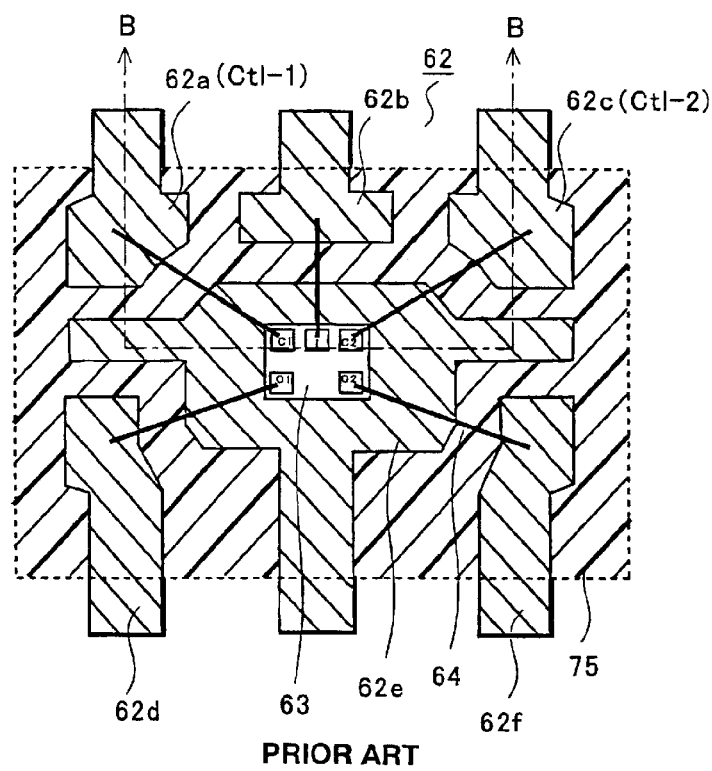
FIG. 1A is a plan view of a conventional packaging of a semiconductor switching device.
Figure 1B:
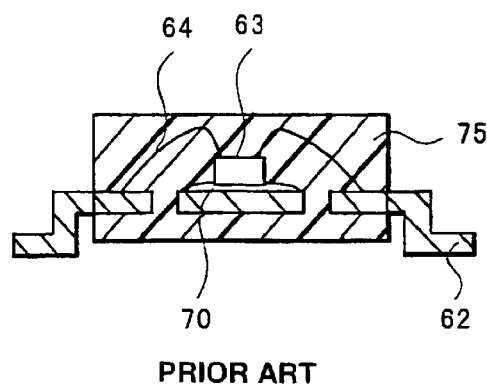
FIG. 1B is a schematic cross-sectional view of the packaging of FIG. 1A cut along line B—B of FIG. 1A.
Figure 2:
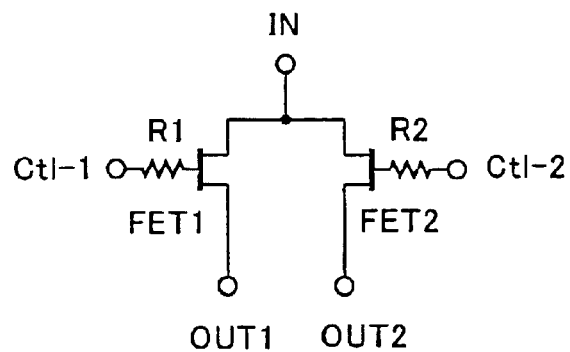
FIG. 2 is a schematic circuit diagram showing a connection of a normal control switch.
Figure 3:
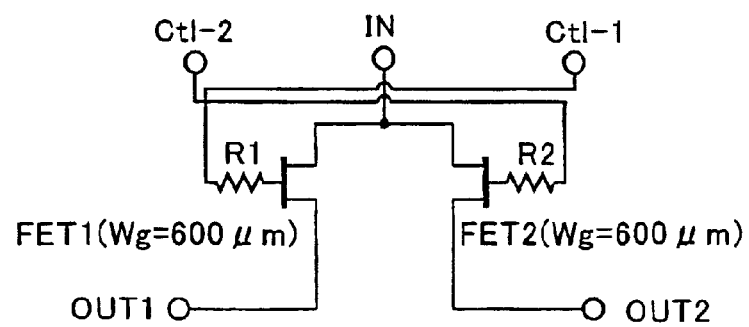
FIG. 3 is a schematic circuit diagram showing a connection of a reverse control switch.

The lead pattern 2 is formed by a plating process based on thick film printing. Accordingly, the separations between the leads are as small as 75 µm. This contributes to reduction of overall packaging size because the minimum separation of the conventional lead pattern formed by stamping as shown in FIG. 1A is as large as 120 µm, which is 0.8×frame thickness (150 µm).

Figure 7:
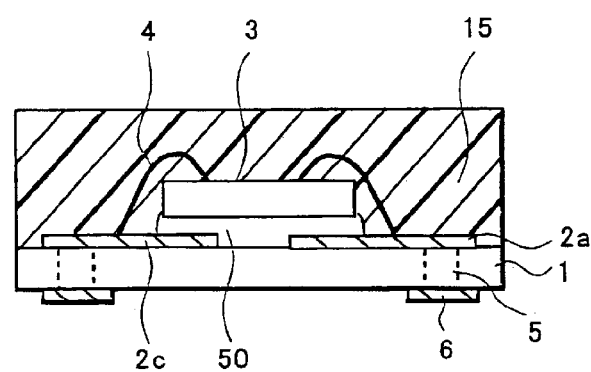
FIG. 7 is a schematic cross-sectional view of the packaging of FIG. 6A cut along line A—A of FIG. 6A.

FIG. 7 is a schematic cross-sectional view of the packaging structure of FIG. 6A cut along line A—A. The compound semiconductor chip 3 is mounted on the leads 2a, 2c with an insulating resin adhesive 50. The electrode pads are connected to the corresponding leads by the bonding wires 4. A through hole 5 is formed in the insulating substrate 1 for each of the leads, and connects the lead to a corresponding external electrode 6 formed on the back side of the insulating substrate 1. The through holes are filled with conducting materials such as tungsten. A resin body 15 seals the semiconductor chip 3.

As indicated by the dotted circles in FIGS. 6A and 6B, six external electrodes 6 are positioned near the edge of the insulating substrate 1 in a symmetrical manner. Namely, the external electrodes 6 for the electrode pads C1, I, C2 are lined up along the top edge of insulating substrate 1, and the external electrodes 6 for the electrode pads O1, O2 and the ground lead 2e are lined up along the bottom edge of the insulating substrate 1.

Four sides of the individual packaging are cut-away surfaces of the resin body 15 and the insulating substrate 1. Top and bottom surfaces of the individual packaging are a flattened top surface of the resin body 15 and the bottom surface of the insulating substrate 1, respectively. In this embodiment, the thickness of the resin body is about 0.3 mm and the thickness of the semiconductor chip 3 is about 130 µm.

Because of the symmetrical configuration of the external electrodes 6, it may be difficult to identify each external electrode 6. For this reason, an identification marking for each external electrode 6 is formed on the top surface of the resin layer 15 at a corresponding location. Markings may be formed by indenting the top surface or printing the top surface.

Because the lead pattern 2 is formed on the insulating substrate 1 by gold plating or the like in this embodiment, overall packaging size is much smaller than the size of the conventional packaging of FIG. 1A, in which a lead pattern is made by stamping a metal plate.

Figure 8A:
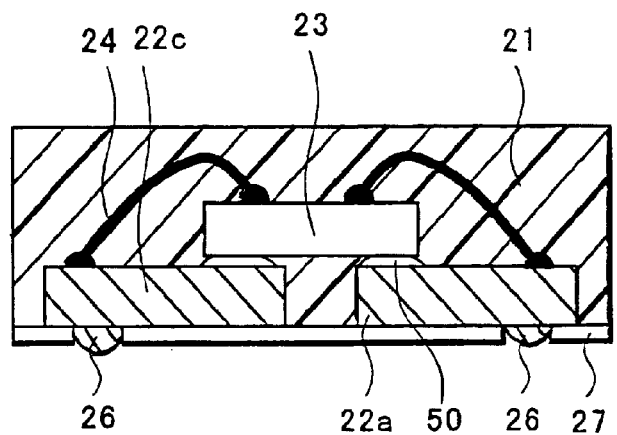
FIG. 8A is a schematic cross-sectional view of a packaging of a second embodiment of the invention.

A semiconductor device with a packaging structure of a second embodiment of this invention is described with reference to FIGS. 8A–9B. FIG. 8A is a cross-sectional view of the semiconductor device of the second embodiment. The lead pattern of this embodiment is substantially the same as the lead pattern 2 of the first embodiment as shown in FIG. 4A. The packaging structure of this embodiment is similar to the packaging structure of the first embodiment shown in the plan view of FIGS. 6A and 6B. The cross section of FIG. 8A is made along line A—A of FIG. 6A. All the leads and the corresponding electrode pads on the chip are positioned and connected in the same manner as in the two configurations of the first embodiment. The chip 23 used in this embodiment is the same chip used in the first embodiment. This packaging also provides two different switches, a normal control switch and a reverse control switch, using the same lead pattern and the same chip just by changing the wire bond connection of two leads.

As shown in FIG. 8A, the difference between the two embodiments is that the lead pattern 22 of the second embodiment is embedded in and supported by the resin body 21. No other support is provided in the second embodiment for the lead pattern 22 of the device. On the other hand, the lead pattern 2 of the first embodiment is supported by the insulating substrate 1.

The resin layer 21 covers the lead pattern 22 and the chip 23, and fills the space 31 between portions of the lead pattern 22. The chip 23 is mounted on the leads (2a 2c in FIG. 6A) with an insulating adhesive 50. The side of the lead pattern 22 is curved inwardly (not shown in the figure) for engaging with the resin body 21 to strengthen the connection between the resin body 21 and the lead pattern 22. A thermosetting resin, such as an epoxy resin, is used to form the resin body 21 by transfer molding and seals the chip 23 and the lead pattern 22. Alternatively, a thermoplastic resin, such as a polyimide resin or a polyphenylene sulfide resin, is used to form the resin body 21 by injection molding.

The thickness of the resin body 21 is adjusted so that the separation between the top of the bonding wire 24 and the top surface of the resin body 21 is about 50 µm. The thickness may vary depending on the mechanical strength required for the packaging. The packaging structure is annealed to flatten out the top surface of the resin body 21. This annealing is required to suppress the bending of the packaging due to the difference in thermal expansion coefficients between the lead pattern 22 and the resin body 21 as well as the difference in contraction rate after a re-flow process.

Figure 8B:
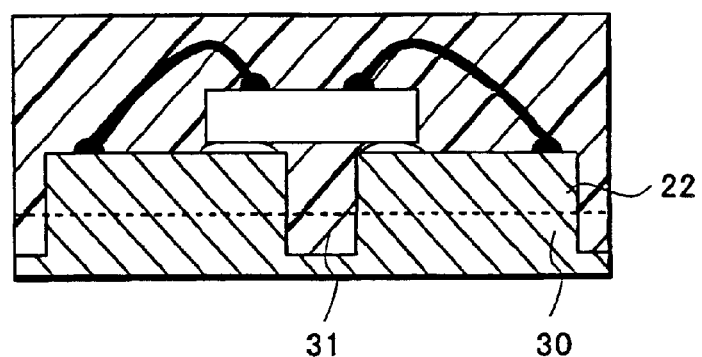
FIG. 8B is a device intermediate of the packaging of FIG. 8A.

FIG. 8B is a cross-sectional view of a device intermediate from which the device shown in FIG. 8A is formed. The lead pattern 22 is formed by creating the space 31 in a conductive foil 30. At this point of manufacturing step, all the lead patterns are a part of the continuous conductive foil 30, as shown in FIG. 9B. Removing the back side of the conductive foil 30 separates the conductive foil 30 into individual lead patterns. The removing methods include grinding, polishing, etching and laser evaporation among other methods. As a result, the lead pattern 22 is exposed on the back side of the resin body 21, and the back surface of the lead pattern 22 and the back surface of the resin body 21 are at the same level.

A photoresist layer 27 covers the back side of the packaging and has openings to expose the back side of the leads. Solder bumps are formed in the openings to work as external electrodes 26. These solder bumps are movable under surface tension during the mounting of the device on a circuit board so that the device and the board are aligned by itself.

Figure 9A:
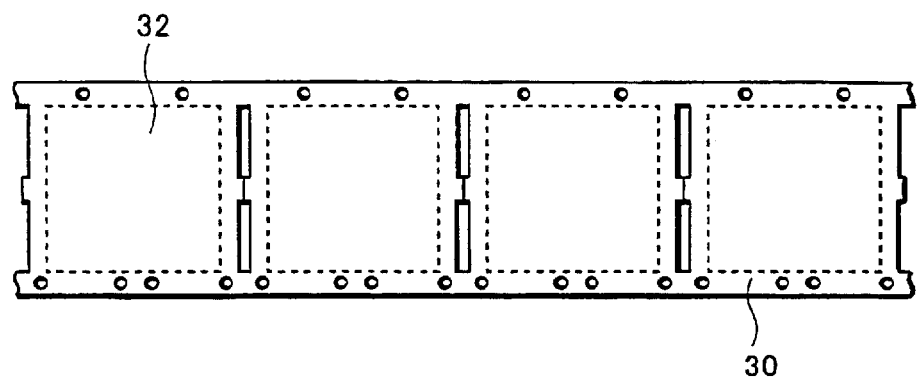
FIG. 9A is a plan view of a conductive foil for forming a lead pattern of the second embodiment.
Figure 9B:
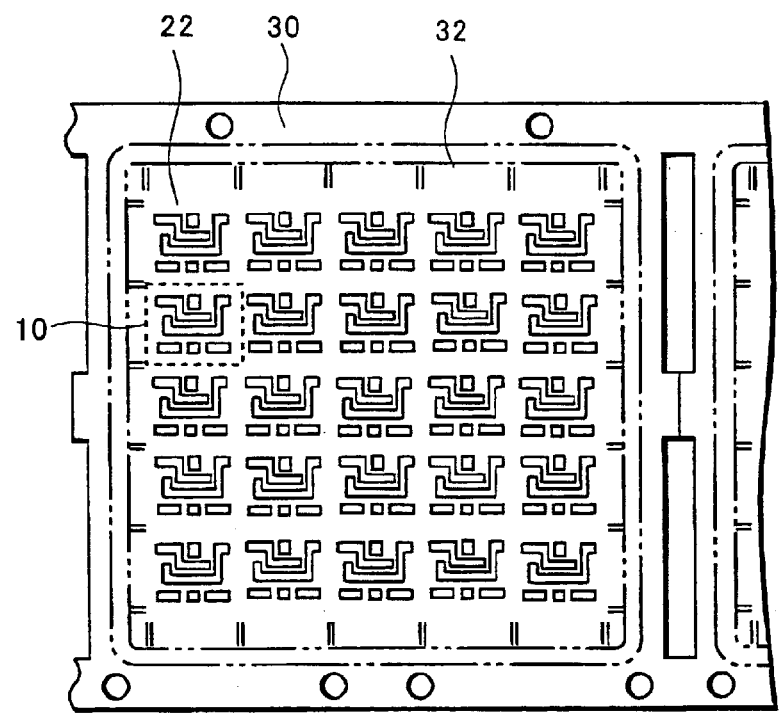
FIG. 9B is a plan view of one frame of the conductive foil of FIG. 9A with lead patterns.

FIG. 9A is a plan view of a conductive foil 30 used for forming the packaging structure of the second embodiment. The conductive foil 30 may be made of copper, and its thickness before the removal of the back side is about 70 µm. The thickness may be anywhere between 10 and 300 µm, and can be outside this range provided that the depth of the space 31 is shorter than the thickness of the conductive foil 30. A plurality of frames 32 is formed in the conductive foil 30. The conductive foil 30 may be also made of aluminum, an iron-nickel alloy or other suitable material. If requirements for adhesion to the soldering materials, adhesion to the resin layer and plating of other metal are met, other metals can be used as the conductive foil 30.

FIG. 9B is an expanded plan view of one frame 32 of the conductive foil 30 of FIG. 9A. The frame 32 contains 25 package areas 10, one of which is indicated by the area encircled by the dotted line in the figure. In the package area 10, the portions encircled by the solid lines represent the portions of the conductive foil 30 that are not etched, and the other portions of the package area 10 represent the portions of the conductive foil 30 that are etched to form the space 31 (FIG. 8B). The unetched portions provide the lead pattern 22 after the back side of the conductive foil 30 is removed. Because the lead pattern 22 is formed by etching, the separations between the leads can be as small as the spatial resolution of the etching method. This contributes to reduction of overall packaging size.

In the second embodiment, the conductive foil 30 supports the chip 23 until the resin body 21 covers the chip 23 and the lead pattern 22. This removes the requirement of an additional support, i.e., the insulating substrate 1 of the first embodiment. Because of the absence of the rigid substrate, the flexible sheet like structure of the conductive foil 30 makes handling of the device intermediate easy and simple during manufacturing.

Figure 10:
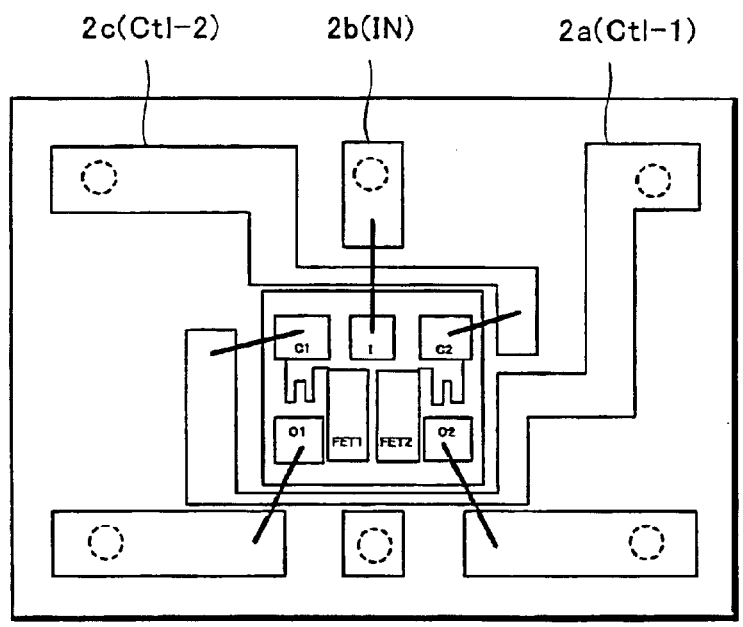
FIG. 10 is a plan view of the packaging of the first embodiment with an alternative lead configuration.

FIG. 10 is a plan view of the packaging of the first embodiment with an alternative lead configuration. This lead configuration is the same as the lead configuration of FIG. 6A except that the leads 2a, 2c do not run underneath the semiconductor chip and instead run along edges of the chip. In this lead configuration as well, each of the two leads 2a, 2c has areas large enough for wire bonding at the ends of the semiconductor chip. Accordingly, the packaging of the first embodiment with this alternative lead configuration also provides both the normal and reverse control switches without any modification to the chip or the lead pattern. This alternative lead configuration is also applied to the second embodiment. It should noted that in the embodiments described above the boding wires are configured not to intersect each other.

In the first and second embodiments, a switching device made of a compound semiconductor is mounted on the lead pattern. However, other semiconductor chips, including other integrated circuits, transistors and diodes that are made of silicon or compound semiconductors, can be mounted on the lead pattern in the packaging. Furthermore, passive elements, including chip capacitors, chip resistors and chip inductors, can be also mounted. Elements that are mounted with the top surface facing the lead pattern can be also mounted in this packaging system. In other words, any surface mounted element can be used in the packaging system of this invention.

The above is a detailed description of particular embodiments of the invention which is not intended to limit the invention to the embodiments described. It is recognized that modifications within the scope of the invention will occur to persons skilled in the art. Such modifications and equivalents of the invention are included within the scope of this invention.

What is claimed is:

1. A semiconductor device with an adjustable wiring connection receiving a first signal and a second signal, the semiconductor device being adapted to operate as a first device with a first wiring connection to output a first set of output signals or as a second device with a second wiring connection to output a second set of output signals, the first and second devices having a lead pattern common thereto and having a semiconductor chip common thereto and mounted on the common lead pattern, the semiconductor device comprising:

an insulating substrate;

a lead pattern comprising a first lead and a second lead that are disposed on the insulating substrate; and a semiconductor chip mounted on the insulating substrate and comprising a first electrode pad and a second electrode pad that are disposed on a surface thereof, wherein the semiconductor chip is disposed on the first and second leads to leave areas of the lead pattern not covered by the semiconductor chip at ends of the semiconductor chip, the uncovered areas of the lead pattern being large enough for connecting the first and second leads to the first and second electrode pads, and the first lead is connected the first electrode pad and the second lead is connected to the second electrode pad under the first wiring connection when the semiconductor device is configured to operate as the first device so that the first electrode pad receives the first signal, the second electrode pad receives the second signal, and the semiconductor device outputs the first set of the output signals, and the first lead is connected to the second electrode pad and the second lead is connected to the first electrode pad under the second wiring connection when the semiconductor device is configured to operate as the second device so that the first electrode pad receives the second signal, the second electrode pad receives the first signal, and the semiconductor device output the second set of the output signals.

2. The semiconductor device of claim 1, wherein the semiconductor chip comprises a compound semiconductor chip having a bottom portion that is semi-insulating and faces the insulating substrate.

3. The semiconductor device of claim 1, wherein the semiconductor chip is mounted on the the first and second leads using an insulating resin.

4. The semiconductor device of claim 1, further comprising a first bonding wire connected to the first electrode pad and a second bonding wire connected to the second electrode pad, wherein the first lead is connected to the first bonding wire at a first end of the semiconductor chip in the first wiring connection and connected to the second bonding wire at a second end of the semiconductor chip in the second wiring connection, and the second lead is connected to the second bonding wire at the second end of the semiconductor chip in the first wiring connection and connected to the first bonding wire at the first end of the semiconductor chip in the second wiring connection.

5. The semiconductor device of claim 1, wherein the semiconductor chip comprises a switching circuit, and the first and second electrode pads receive control signals of the switching circuit.

6. The semiconductor device of claim 1, further comprising a plurality of conducting through holes penetrating through the insulating substrate, two of the through holes being connected to the first and second leads, and a plurality of external electrodes formed on a back side of the insulating substrate, each of the external electrodes being connected to one of the through holes.

7. A semiconductor device with an adjustable wiring connection receiving a first signal and a second signal, the semiconductor device being adapted to operate as a first device with a first wiring connection to output a first set of output signals or as a second device with a second wiring connection to output a second set of output signals, the first and second devices having a lead pattern common thereto and having a semiconductor chip common thereto and mounted on the common lead pattern the semiconductor device comprising:

a resin body;

a lead pattern comprising a first lead and a second lead that are embedded in the resin body; and a semiconductor chip embedded in the resin body and having a first electrode pad and a second electrode pad that are disposed on a surface thereof, wherein the semiconductor chip is disposed on front surfaces of the first and second leads to leave areas of the lead pattern not covered by the semiconductor chip at ends of the semiconductor chip, the uncovered areas of the lead pattern being large enough for connecting the first and second leads to the first and second electrode pads, and an electrode for external connection being disposed on a back surface of each of the first and second leads, and the first lead is connected to the first electrode pad and the second lead is connected to the second electrode pad under the first wiring connection when the semiconductor device is configured to operate as the first device so that the first electrode pad receives the first signals, the second electrode pad receives the second signal, and the semiconductor device outputs the first set of the output signals, and the first lead is connected to the second electrode pad and the second lead is connected to the first electrode pad under the second wiring connection when the semiconductor device is configured to operate as the second device so that the first electrode pad receives the second signal, the second electrode pad receives the first signal, and the semiconductor device output the second set of the output signals.

8. The semiconductor device of claim 7, wherein the semiconductor chip comprises a compound semiconductor chip having a bottom portion that is semi-insulating and faces the leads.

9. The semiconductor device of claim 7, wherein the semiconductor chip is mounted on the first and second leads using an insulating resin.

10. The semiconductor device of claim 7, further comprising a first bonding wire connected to the first electrode pad and a second bonding wire connected to the second electrode pad, wherein the first lead is connected to the first bonding wire at a first end of the semiconductor chip in the first wiring connection and connected to the second bonding wire at a second end of the semiconductor chip in the second wiring connection, and the second lead is connected to the second bonding wire at the second end of the semiconductor chip in the first wiring connection and connected to the first bonding wire at the first end of the semiconductor chip in the second wiring connection.

11. The semiconductor device of claim 7, wherein the semiconductor chip comprises a switching circuit, and the first and second electrode pads receive control signals of the switching circuit.

12. The semiconductor device of claim 7, further comprising additional leads and an additional electrode for external connection formed on a back surface of each of the additional leads that are not the first and second leads on which the semiconductor ship is disposed.

13. A semiconductor device with an adjustable wiring connection comprising a switching circuit and receiving a first control signal and a second control signal of the switching circuit, the semiconductor device being adapted to operate as a first switch or as a second switch, the first and second switches having a lead pattern common thereto and having a semiconductor chip common thereto and mounted on the common lead pattern the semiconductor device, comprising:

an insulating substrate;

a lead pattern comprising a first lead and a second lead that are disposed on the insulating substrate; and a semiconductor chip mounted on the insulating substrate and having a first electrode pad and a second electrode pad that are disposed on a surface thereof, and the semiconductor chip comprising the switching circuit, wherein the semiconductor chip is disposed between the first and second leads, the first and second electrode pads receiving the first and second control signals of the switching circuit, and the first lead is connected to the first electrode pad and the second lead is connected to the second electrode pad when the semiconductor device is configured to operate as the first switch so that the first electrode pad receives the first control signal and the second electrode pad receives the second control signal, and the first lead is connected to the second electrode pad and the second lead is connected to the first electrode pad when the semiconductor device is configured to operate as the second switch so that the first electrode pad receives the second control signal and the second electrode pad receives the first control signal.

14. A semiconductor device with an adjustable wiring connection comprising a switching circuit and receiving a first control signal and a second control signal of the switching circuit, the semiconductor device being adapted to operate as a first switch or as a second switch, the first and second switches having a lead pattern common thereto and having a semiconductor chip common thereto and mounted on the common lead pattern, the semiconductor device, comprising:

a resin body;

a lead pattern comprising a first lead and a second lead that are embedded in the resin body; and a semiconductor chip embedded in the resin body and having a first electrode pad and a second electrode pad that are disposed on a surface thereof, and the semiconductor chip comprising switching circuit, wherein the semiconductor chip is disposed between the first and second leads, the first and second electrode pads receiving the first and second control signals of the switching circuit, and the first lead is connected to the first electrode pad and the second lead is connected to the second electrode pad when the semiconductor device is configured to operate as the first switch so that the first electrode pad receives the first control signal and the second electrode pad receives the second control signal, and the first lead is connected to the second electrode pad and the second lead is connected to the first electrode pad when the semiconductor device is configured to operate as the second switch so that the first electrode pad receives the second control signal and the second electrode pad receives the first control signal.

15. A method of fabricating a semiconductor device with an adjustable wiring connection receiving a first signal and a second signal, the semiconductor device being adapted to operate as a first device with a first wiring connection to output a first set of output signals or as a second device with a second wiring connection to output a second set of output signals, the first and second devices having a lead pattern common thereto and having a semiconductor chip common thereto and mounted on the common lead pattern, the method comprising:

providing a lead pattern comprising a first lead and a second lead;

mounting a semiconductor chip on the first and second leads to leave areas of the lead pattern not covered by the semiconductor chip at ends of the semiconductor chip, the uncovered areas of the lead pattern being large enough for connecting the first and second leads to the first and second electrode pads, and the semiconductor chip having a first electrode pad and a second electrode pad that are disposed on a surface thereof; and connecting the first lead to the first electrode pad and connecting the second lead to the second electrode pad under the first wiring connection when the semiconductor device is configured to operate as the first device so that the first electrode pad receives the first signal, the second electrode pad receives the second signal, and the semiconductor device outputs the first set of the output signals, or connecting the first lead to the second electrode pad and connecting the second lead to the first electrode pad under the second wiring connection when the semiconductor device is configured to operate as the second device so that the first electrode pad receives the second signal, the second electrode pad receives the first signal, and the semiconductor device output the second set of the output signals.

16. The method of claim 15, further comprising forming the lead pattern on an insulating substrate.

17. The method of claim 16, further comprising providing an external electrode for each of the first and second leads on a back side of the insulating substrate, each of the external electrodes being connected to a corresponding lead by a corresponding conducting through hole formed in the insulating substrate.

18. The method of claim 15, further comprising covering the lead pattern and the semiconductor chip with a resin.

19. The method of claim 18, further comprising removing a back side of the lead pattern.

* * * * *